US009317075B2

(12) United States Patent
Ng et al.

(10) Patent No.: US 9,317,075 B2
(45) Date of Patent: Apr. 19, 2016

(54) SHIELDING PANEL HAVING AN OPENING FOR A HEAT SINK

(71) Applicant: Hewlett-Packard Development Company, L.P., Fort Collins, CO (US)

(72) Inventors: Kah Hoe Ng, Singapore (SG); Tzye Perng Poh, Singapore (SG); Kian Teck Poh, Singapore (SG)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 260 days.

(21) Appl. No.: 13/872,940

(22) Filed: Apr. 29, 2013

(65) Prior Publication Data

US 2014/0321051 A1 Oct. 30, 2014

(51) Int. Cl.
*G06F 1/20* (2006.01)
*H05K 7/14* (2006.01)
*H05K 9/00* (2006.01)
*H01B 9/06* (2006.01)
*F28F 7/00* (2006.01)
*G06F 1/18* (2006.01)
*H05K 7/20* (2006.01)

(52) U.S. Cl.
CPC *G06F 1/182* (2013.01); *G06F 1/20* (2013.01); *G06F 1/206* (2013.01); *H05K 7/2039* (2013.01); *H05K 7/20154* (2013.01); *H05K 9/0009* (2013.01); *H05K 9/0041* (2013.01); *H05K 7/20409* (2013.01); *H05K 7/20436* (2013.01)

(58) Field of Classification Search
CPC ... H05K 7/20; H05K 7/2039; H05K 7/20409; H05K 7/20436; H05K 9/0009; G06F 1/20; G06F 1/206; G06F 1/182
USPC ............ 361/800, 816, 818, 679.47, 702, 709, 361/711–713, 676–678, 679.46, 361/679.48–679.54, 688–701, 703–708, 361/723, 752, 760, 762, 831; 174/16.1, 174/16.3; 165/80.3, 122; 454/184
See application file for complete search history.

(56) References Cited

U.S. PATENT DOCUMENTS

| 6,011,701 A | 1/2000 | Kopp et al. |
| 6,141,213 A | 10/2000 | Antonuccio et al. |
| 6,722,423 B1 | 4/2004 | Wei |
| 6,724,624 B1 * | 4/2004 | Dodson ......................... 361/695 |
| 7,403,385 B2 | 7/2008 | Boone et al. |
| 2007/0206353 A1 * | 9/2007 | Boone et al. .................. 361/694 |
| 2011/0063802 A1 * | 3/2011 | Chen et al. .................... 361/709 |

OTHER PUBLICATIONS

"Airflow Management Solutions," Data Center Products, 2011, pp. 1-16, Eaton Corporation, Cleveland, Ohio, USA.

* cited by examiner

*Primary Examiner* — Courtney Smith
*Assistant Examiner* — Zhengfu Feng
(74) *Attorney, Agent, or Firm* — Hewlett Packard Enterprise Patent Department

(57) ABSTRACT

An example provides an apparatus including a shielding panel in spaced relation to a substrate such that a heat sink mounted on the substrate protrudes through an opening in the shielding panel. A first airflow path may be provided between the substrate and a first side of the shielding panel, and a second airflow path may be provided on a second side of the shielding panel across a portion of the heat sink protruding through the opening.

14 Claims, 6 Drawing Sheets

SHIELDING PANEL HAVING AN OPENING FOR A HEAT SINK

BACKGROUND

Electronic modules are sometimes endowed with features to protect against acquisition of knowledge of the hardware design, acquisition of sensitive information stored by the electronic module, or both. For example, communication devices can store cryptographic keys, handhelds can store passwords and records, and embedded systems can hold sensitive algorithms or information in memory. In some instances, an electronic module may be subject to requirements under the Federal Information Processing Standard (FIPS), which may require physical measures to deter direct observation of the electronic module's internal components and design information to prevent a determination of the composition or implementation of the electronic module.

BRIEF DESCRIPTION OF THE DRAWINGS

The detailed description section references the drawings, wherein.

DETAILED DESCRIPTION OF EMBODIMENTS

Electronic modules are sometimes equipped with features to prevent disclosure of an internal design of the electronic module. In some instances, an electronic module may be subject to requirements under the Federal Information Processing Standard (FIPS), FIPS PUB 140-2, "Security Requirements for Cryptographic Modules"(available at http://csrc.nist.gov/publications/fips/fips140-2/fips1402.pdf),for example, may require physical measures to deter direct observation of the electronic module's internal components and design information to prevent a determination of the composition or implementation of the electronic module.

Security measures may be configured to block visual inspection of the internal components of an electronic module, but these measures sometimes impact ventilation through the electronic module. For example, opaque shields are sometimes placed over the ventilation openings of the housing for the electronic module, but doing so may result in the temperature inside the housing to rise, which may impact the performance of the electronic module. To deal with this temperature issue, the thermal specification of the electronic module may need to be lower than a similar electronic module without FIPS-compliant shields.

Described herein are embodiments of an apparatus including a shielding panel in spaced relation to a substrate such that a heat sink mounted on the substrate protrudes through an opening in the shielding panel. In various implementations, the shielding panel may be arranged to obstruct viewing of the electronic component through the ventilation inlet and the ventilation outlet, without blocking the ventilation inlet or the ventilation outlet. In some implementations, a first airflow path may be provided between the substrate and a first side of the shielding panel, and a second airflow path may be provided on a second side of the shielding panel across a portion of the heat sink protruding through the opening.

Figure 1A:
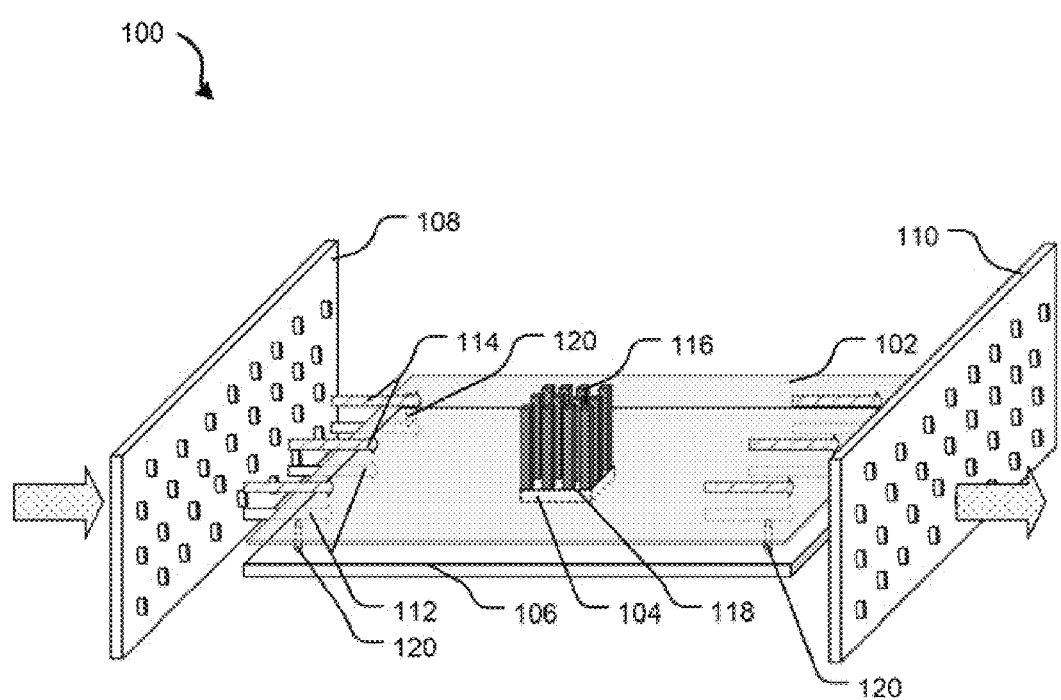
FIG. 1A is a perspective view of an example apparatus including a shielding panel having an opening for a heat sink, in accordance with various implementations.
Figure 1B:
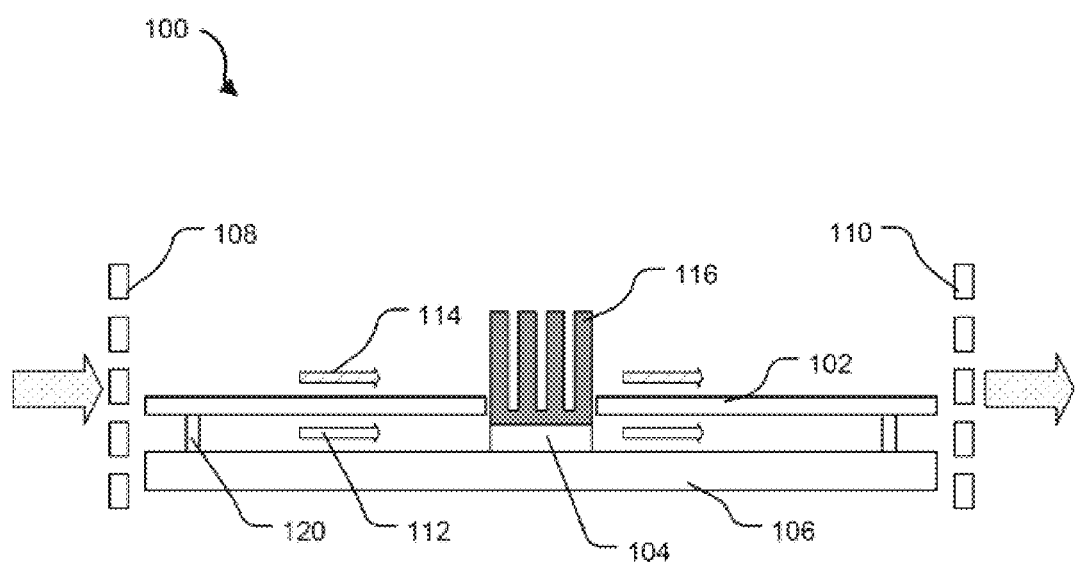
FIG. 1B is a side view of the apparatus of FIG. 1A.

Turning now to FIGS. 1A and 1B, illustrated is an example apparatus 100 including a shielding panel 102 and an electronic component 104. The electronic component 104 may be mounted on a substrate 106. The substrate 106 may be a circuit board or another type of substrate for mechanically support and/or electrically connecting the electronic component 104 with another component of the apparatus 100.

The apparatus 100 may comprise any apparatus for which the substrate 104 is to be at least partially obstructed. In some implementations, the apparatus 100 may be an apparatus subject to the requirements under FIPS (such as, e.g., FIPS PUB 140-2). For example, in some implementations, the apparatus 100 may be an information technology module such as, for example, a network switch, a server, a data storage device, networking equipment, or other computing or networking devices, although the present disclosure is not limited in this respect. In some implementations, the apparatus 100 may be a computer, a display device, a set-top box, a game console, a television, or another type of device.

A housing wall 108 including a ventilation inlet (hereinafter "ventilation inlet 108") and a housing wall 110 including a ventilation outlet (hereinafter "ventilation outlet 110") may provide a pathway for airflow through the apparatus 100. As illustrated, the ventilation inlet 108 and the ventilation outlet 110 may be arranged on opposite sides of the apparatus, which may facilitate the airflow through the apparatus 100. The substrate 106 may be arranged in spaced relation to the shielding panel 102 to provide a first airflow path 112 between the substrate 106 and a first side of the shielding panel 102, and a second airflow path 114, parallel to the first airflow path 112, on a second side of the shielding panel 102 across a portion of a heat sink 116 protruding through an opening 118 in the shielding panel 102. As illustrated, the shielding panel 102 may obstruct viewing of the substrate 106 through the ventilation inlet 108 and the ventilation outlet 110, while minimally obstructing airflow through the ventilation inlet 108 and outlet 110, which may allow the apparatus 100 to be implemented with a higher thermal performance specification than would otherwise be possible by covering the ventilation inlet 108 and outlet 110.

The heat sink 116 may be mounted on an electronic component 104, which may be mounted on the substrate 106, and may provide cooling to the electronic component 104. The heat sink 116 may comprise a passive heat sink or an active heat sink. In various implementations, the electronic component 104 may be mounted on the substrate 106, and the heat sink 116 may be coupled to the electronic component 104. The electronic component 104 may comprise any of a number of electronic components. In some implementations, the electronic component 104 may comprise a semiconductor device (such as, e.g., an integrated circuit chip, etc.) or an optoelectronic device (such as, e.g. a laser, a light emitting diode, etc.), among others.

The shielding panel 102 may be coupled to the substrate 106 using any suitable fasteners 120. In some implementations, the fasteners 120 may comprise screws, rivets, adhesive, brackets, or other suitable fasteners. In some implementations, the shielding panel 102 may not be fastened to the substrate 106. For example, the shielding panel 102 may be configured to rest on the substrate 106 or may be fastened to the housing of the apparatus 100.

The shielding panel 102 may comprise any of a number of materials. In various implementations, the shielding panel 102 may comprise any material having an opacity sufficient to obstruct viewing of the electronic component 104 on the substrate 106. In some implementations, the shielding panel 102 may comprise any material having an opacity sufficient to meet the requirements under FIPS (such as, for example, FIPS PUB 140-2). In some implementations, the shielding panel 102 may comprise a sheet, a plate, or a mesh of plastic, metal, paper, polymer, or another material suitable for obstructing viewing of the electronic component 104.

In various implementations, the shielding panel 102 may provide electromagnetic shielding for the substrate 106. In various ones of these implementations, the shielding panel 102 may comprise a conductive material for providing full ground shielding. For example, the shielding panel 102 may comprise a sheet, a plate, or a mesh of a metal or semi-conductive material suitable for providing electromagnetic shielding. In various examples, the shielding panel 102 may repulse electromagnetic pulses that could otherwise be capable of disrupting performance of the apparatus 100.

Although FIGS. 1A and 1B generally depict the opening 118 as being substantially centered in the shielding panel 102, other configurations may be possible and may depend on the arrangement of an electronic component and/or heat sink on a substrate arranged in spaced relation to the shielding panel 102. In addition, a shielding panel within the scope of the present disclosure may include more than one opening to accommodate more than one heat sink.

Figure 2:
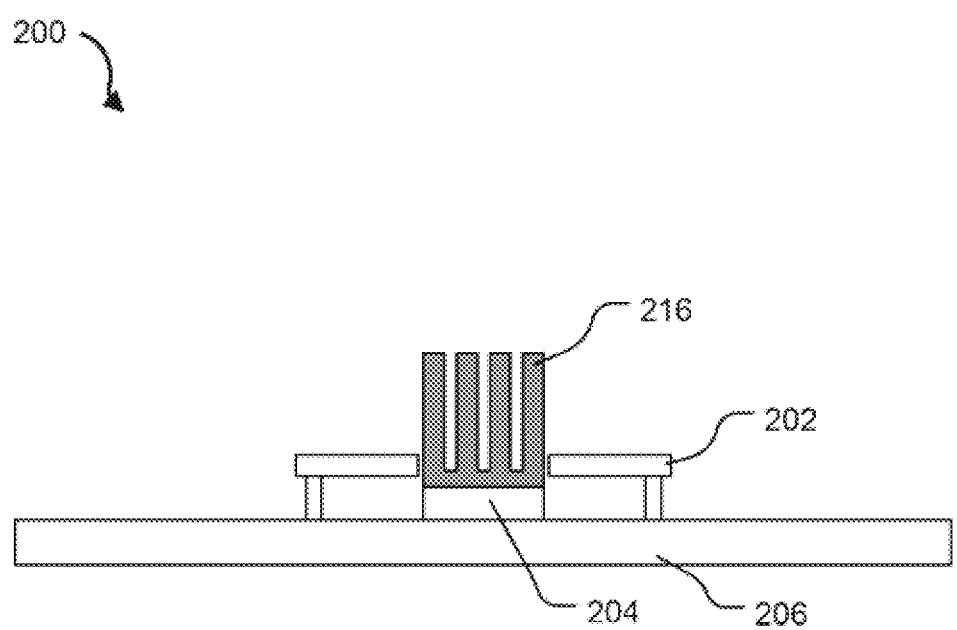
FIG. 2 is a side view of another example apparatus including a shielding panel having an opening for a heat sink, in accordance with various implementations.

Additionally, although FIGS. 1A and 1B generally depict the shielding panel 102 as having an area that is substantially similar to the area of the substrate 106, other configurations may be possible. For various implementations in which the shielding panel 102 has an area that is substantially similar to the area of the substrate 106, a view of the entire or substantially entire surface of the substrate 106 may be obstructed. FIG. 2 illustrates another implementation of an apparatus 200 in which the shielding panel 202 has an area that is smaller than the area of the substrata 206. In various ones of these latter implementations, the shielding panel 202 may be implemented with a size sufficient to obstruct viewing of the electronic component 204 alone or another subset of the substrate 206, while allowing protrusion of a heat sink 216 mounted on the substrate 206.

Figure 3A:
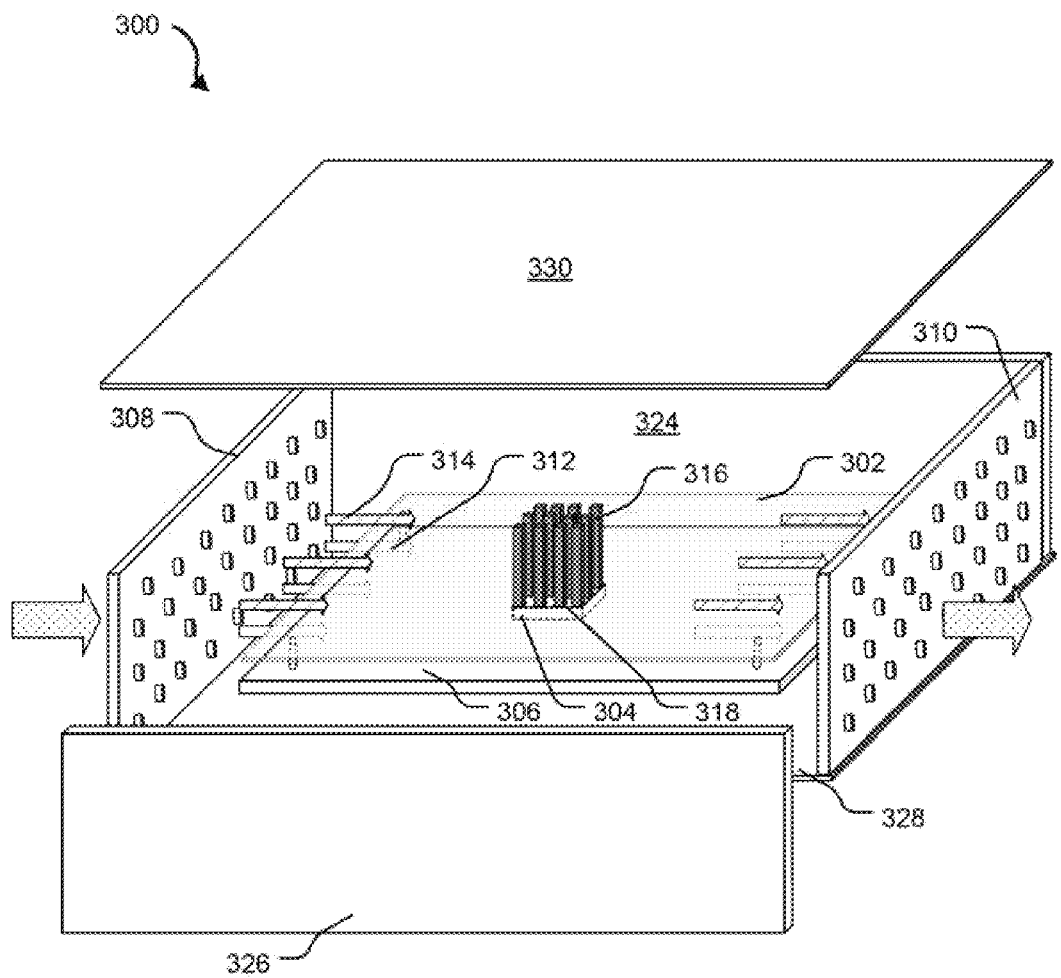
FIG. 3A is a partially exploded view of another example apparatus including a shielding panel having an opening for a heat sink, in accordance with various implementations.
Figure 3B:
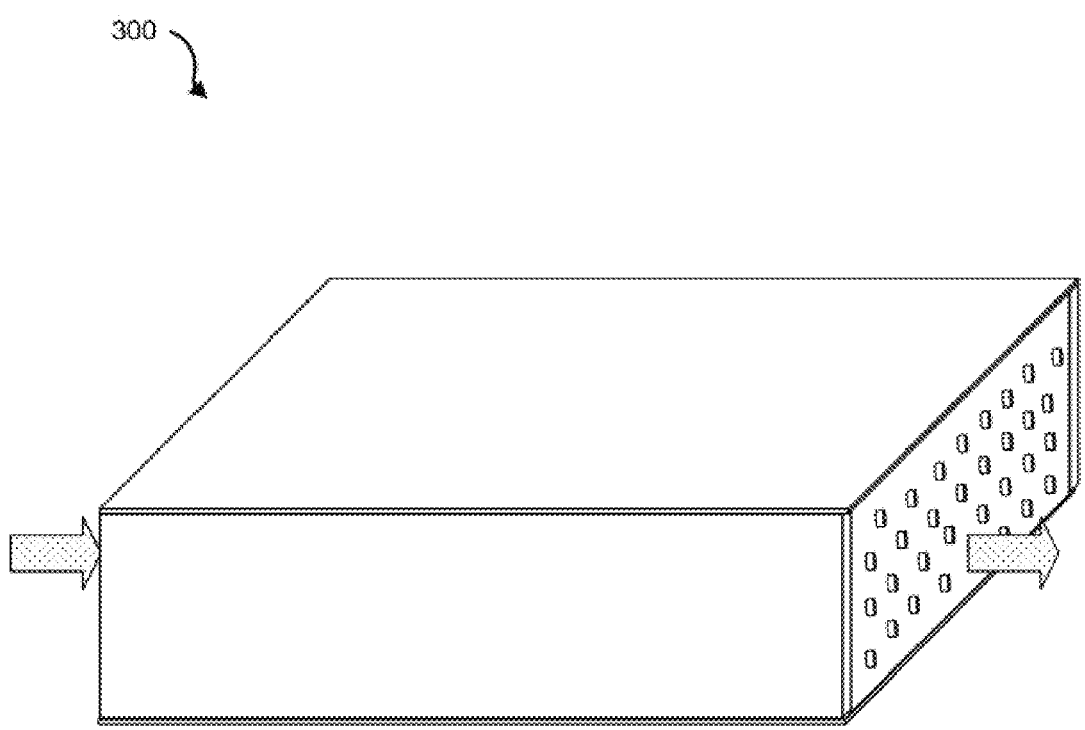
FIG. 3B is a side view of the apparatus of FIG. 3A.

FIGS. 3A and 3B illustrate another apparatus 300, in accordance with various implementations. As illustrated, the apparatus 300 includes a shielding panel 302 and a substrate 306. The substrate 306 may include an electronic component 104 mounted thereon, and a heat sink 316 mounted on the electronic component 304. The shielding panel 302 may include an opening 318 through which the heat sink 316 may protrude.

The apparatus 300 may comprise any apparatus for which the substrate 306 is to be at least partially obstructed. In some implementations, the apparatus 300 may be an apparatus subject to the requirements under FIPS (such as, e.g., FIPS PUB 140-2). For example, in some implementations, the apparatus 300 may be a network switch or a server. In some implementations, the apparatus 300 may be a computer, a display device, a set-top box, a game console, a television, or another type of device.

The shielding panel 302 and the substrate 306 having the electronic component 304 and the heat sink 316 mounted thereon may be enclosed in a housing having a ventilation inlet 308, a ventilation outlet 310, sidewalls 324 and 326, a floor panel 328, and a top panel 330. The ventilation inlet 308 and the ventilation outlet 310 of the housing may provide a pathway for airflow through the apparatus 300, and may be arranged on opposite sides of the housing to facilitate the airflow. The substrate 306 may be arranged in spaced relation to the shielding panel 302 to provide a first airflow path 312 between the substrate 306 and a first side of the shielding panel 302, and a second airflow path 314, parallel to the first airflow path 312, on a second side of the shielding panel 302 across a portion of the heat sink 316. The shielding panel 302 and the substrate 306 may be arranged in a non-parallel manner to the ventilation inlet 308 and ventilation outlet 310 to facilitate provision of the first airflow path 312 and the second airflow path 314.

Figure 4:
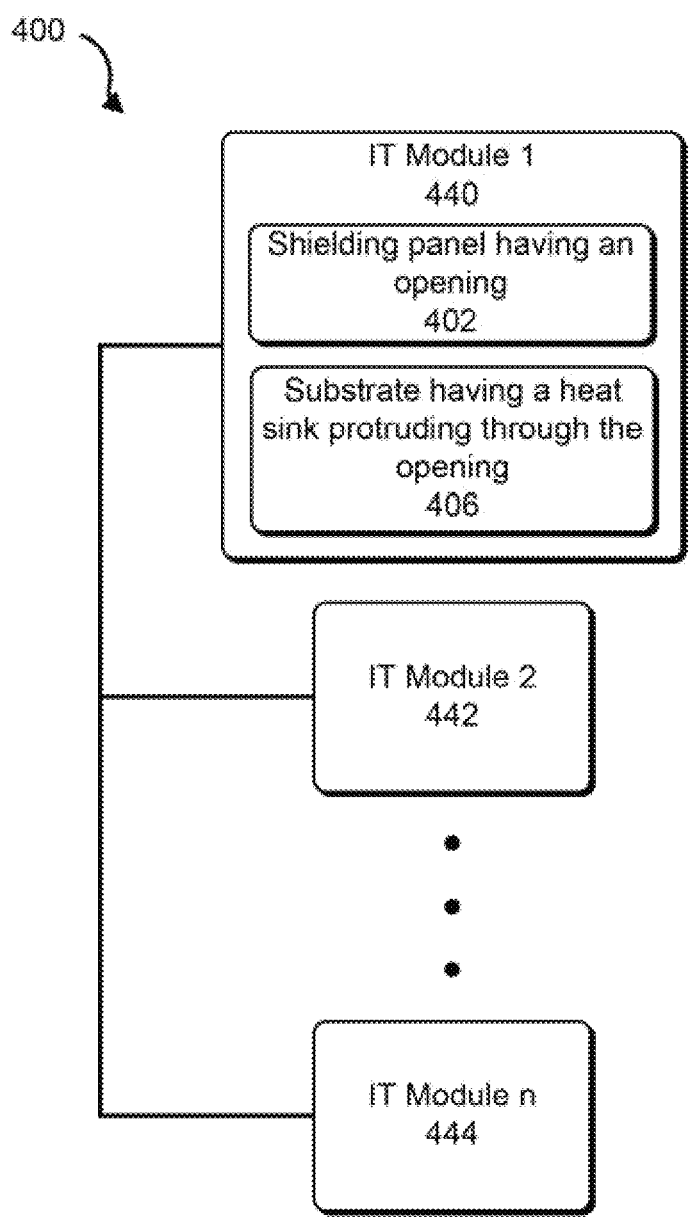
FIG. 4 a block diagram of an example system including a shielding panel having an opening for a heat sink, in accordance with various implementations.

The various apparatuses described herein may be stand-alone devices or may be incorporated into various types of systems such as system 400 illustrated in FIG. 4. As illustrated, the system 400 may include a plurality of IT modules 440, 442, 444. The IT module 440 may include a shielding panel 402 and a substrate 406. The substrate 406 may include an electronic component mounted thereon, and a heat sink mounted on the electronic component. The shielding panel 402 may include an opening through which the heat sink may protrude. In various implementations, the IT module 440 may be identical or substantially similar to any of the apparatuses 100, 200, or 300 described herein with reference to FIGS. 1A/1B, 2, or 3A/3B, respectively.

The IT modules 440, 442, 444 may be identical to one another or may include two or more different types of IT modules. In various implementations, an IT module of the plurality of IT modules 440, 442, 444 may comprise networking switch, a server, a data storage device, other networking device, or other computing device, although the present disclosure is not limited in this respect. In various examples, the system 400 may comprise a sever rack. In various implementations, the IT module 440 may comprise a network switch. In various ones of these implementations, the IT module 440 may be configured to interconnect one of the IT modules 442 with another one of the IT modules 444.

Though not illustrated, in some implementations, the system 400 may include memory, I/O devices, user controls, memory and I/O controllers, communications interfaces, etc.

Various aspects of the illustrative embodiments are described herein using terms commonly employed by those skilled in the art to convey the substance of their work to others skilled in the art. It will be apparent to those skilled in the art that alternate embodiments may be practiced with only some of the described aspects. For purposes of explanation, specific umbers, materials, and configurations are set forth in order to provide a thorough understanding of the illustrative embodiments. It will be apparent to one skilled in the art that alternate embodiments may be practiced without the specific details. In other instances, well-known features are omitted or simplified in order not to obscure the illustrative embodiments.

The phrases "in an example," "in various examples," "in some examples," "in various embodiments," and "in some embodiments" are used repeatedly. The phrases generally do not refer to the same embodiments; however, they may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B, and C" means (A), (B), (C), (A and B), (A and C), (B and C), or (A, B and C). The phrase "(A) B" means (B) or (A and B), that is, A is optional.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a wide variety of ways. This application is intended to cover any adaptations or variations of the embodiments discussed herein. It is manifestly intended, therefore, that embodiments be limited only by the claims and the equivalents thereof.

What is claimed is:

1. An apparatus comprising:
   a shielding panel having an opening; and
   a substrate having a heat sink mounted thereon, the substrate in spaced relation to the shielding panel to provide a first airflow path between the substrate and a first side of the shielding panel, and a second airflow path on a second side of the shielding panel across a portion of the heat sink protruding through the opening, wherein the substrate includes an electronic component, wherein the shielding panel is to obstruct viewing of the electronic component through a ventilation inlet and a ventilation outlet of the apparatus.

2. The apparatus of claim 1, wherein the heat sink is coupled to the electronic component.

3. The apparatus of claim 1, wherein the shielding panel is coupled to the substrate.

4. The apparatus of claim 1, wherein the substrate comprises a circuit board.

5. The apparatus of claim 1, wherein the first airflow path is parallel to the second airflow path.

6. The apparatus of claim 1, wherein the shielding panel comprises a conductive material.

7. An apparatus comprising:
   a housing including a ventilation inlet and a ventilation outlet; and
   a shielding panel between the ventilation inlet and the ventilation outlet, and in spaced relation to an electronic component housed within the housing, wherein a heat sink coupled to the electronic component protrudes through an opening in the shielding panel, wherein the shielding panel is to obstruct viewing of the electronic component through the ventilation inlet and the ventilation outlet.

8. The apparatus of claim 7, wherein the shielding panel, the electronic component, and the heat sink are housed within the housing.

9. The apparatus of claim 7, wherein the housing includes a first wall having the ventilation inlet and a second wall having the ventilation outlet.

10. The apparatus of claim 9, wherein the first wall and the second wall are on opposite sides of the housing.

11. The apparatus of claim 9, wherein the shielding panel is nonparallel to the first wall and the second wall.

12. The apparatus of claim 7, wherein the apparatus is a network switch or a server.

13. A system comprising:
    an information technology module; and
    a network switch to interconnect the information technology module with at least one other information technology module of the system, the network switch including:
    a shielding panel having an opening; and
    a substrate having a heat sink mounted thereon, the substrate in spaced relation to the shielding panel to provide a first airflow path between the substrate and a first side of the shielding panel, and a second airflow path on a second side of the shielding panel across a portion of the heat sink protruding through the opening, wherein the substrate includes an electronic component, wherein the shielding panel is to obstruct viewing of the electronic component through a ventilation inlet and a ventilation outlet of the network switch.

14. The system of claim 13, wherein the information technology module comprises a server, a data storage device, or a networking device.

\* \* \* \* \*